United States Patent

[11] 3,621,284

[72] Inventors Ronald D. Cluett
Gloucester;
Vincent E. Larka, Burlington, both of Mass.

[21] Appl. No. 95,656
[22] Filed Dec. 7, 1970
[45] Patented Nov. 16, 1971
[73] Assignee Sylvania Electric Products, Inc.

[54] ATTENUATION CIRCUIT
12 Claims, 5 Drawing Figs.

[52] U.S. Cl. .......... 307/237, 307/230, 307/264, 307/304, 328/171
[51] Int. Cl. .......... H03k 5/08
[50] Field of Search .......... 307/230, 235, 237, 264, 304; 328/31, 53, 54, 168, 169, 171

[56] References Cited

UNITED STATES PATENTS

| | | | |
|---|---|---|---|
| 3,522,453 | 8/1970 | Simons et al. | 307/264 X |
| 3,525,880 | 8/1970 | Donnell et al. | 307/237 |
| 3,530,308 | 9/1970 | Pawletko | 307/237 |
| 3,539,909 | 11/1970 | Morrison | 307/237 X |

*Primary Examiner*—Stanley D. Miller, Jr.
*Attorneys*—Norman J. O'Malley, Elmer J. Nealon and Peter Xiarhos ABSTRACT: An attenuation circuit including a field effect transistor and a bypass circuit coupled to the field effect transistor for providing a wide range of attenuation values. An input signal to be attenuated is applied to the drain electrode of the field effect transistor and also to the bypass circuit, and a DC control voltage is applied to the gate electrode of the field effect transistor and to the bypass circuit. The field effect transistor and the bypass circuit each operate to cause attenuation of the input signal by a predetermined amount. As a result, the input signal applied to the drain electrode of the field effect transistor and to the bypass circuit is attenuated by a total amount related to the combined values of attenuation provided by the field effect transistor and the bypass circuit and applied via the source electrode of the field effect transistor to an output terminal.

INVENTORS
RONALD D. CLUETT
VINCENT E. LARKA
BY
Peter Xiarhos

INVENTORS
RONALD D. CLUETT
VINCENT E. LARCA
BY
Peter Xiarhos

ATTENUATION CIRCUIT

BACKGROUND OF THE INVENTION

The present invention relates to an attenuation circuit. More particularly, it is concerned with an attenuation circuit including a variable-resistance device such as a field effect transistor and a bypass circuit coupled to the variable-resistance device for providing a wide range of attenuation values.

The use of a variable-resistance device for attenuating electrical signals is well known to those skilled in the art. For example, it is well known to use a variable-resistance device such as a field effect transistor for attenuating electrical signals applied to a drain or source electrode thereof while a control voltage is applied to the gate electrode thereof. Although a field effect transistor is suitable for use in many applications, it provides a rather narrow range of attenuation values (for example, from approximately 0 to 40 db.) due to the fact that it is incapable of providing significant increases in attenuation of input signals at values of gate voltage greater than the value of gate voltage at which the field effect transistor operates in its saturation region. Thus, where a wide range of attenuation values is desired or needed, for example, from approximately 0 to 100 db. a field effect transistor alone is not satisfactory. Other types of variable-resistance devices are similarly unsatisfactory. It is therefore a principal object of the present invention to provide an attenuation circuit capable of providing a wide range of attenuation values and which, it its preferred form, includes a field effect transistor.

BRIEF SUMMARY OF THE INVENTION

In accordance with the present invention, an attenuation circuit is provided for attenuating an input signal which generally includes a variable-impedance means, a bypass circuit means, and a control signal source means. The variable-impedance means has a first terminal for receiving an input signal to be attenuated, a second terminal, and a control terminal. The bypass circuit means has a first connection to the first terminal of the variable-impedance means, and a control signal connection.

In the operation of the attenuation circuit of the invention, the control signal source means is adapted to apply a control signal to the control terminal of the variable-impedence means and to the control signal connection of the bypass circuit means. The variable-impedance means operates in response to the control signal at the control terminal thereof to establish an impedance between its first and second terminals having a value related to the value of the control signal. As a result, an input signal at the first terminal of the variable-impedance means by an amount related to the value of the impedance between it first and second terminals. The bypass circuit means operates in response to the control signal at the control signal connection thereof to bypass a portion of the input signal at the first terminal of the variable-impedance means away from the first terminal thereby resulting in additional attenuation of the input signal. The particular amount of attenuation provided by the bypass circuit means is related to the value of the control signal. As a result of the above operation of the variable-impedance means and the bypass circuit means, the input signal at the first terminal of the variable-impedance means is attenuated by a total amount determined by the combined amounts of attenuation provided by the variable-impedance means and by the bypass circuit means. The resulting attenuated input signal is presented at the second terminal of the variable-impedance means.

GENERAL DESCRIPTION OF THE INVENTION—FIG. 1

Figure 1:
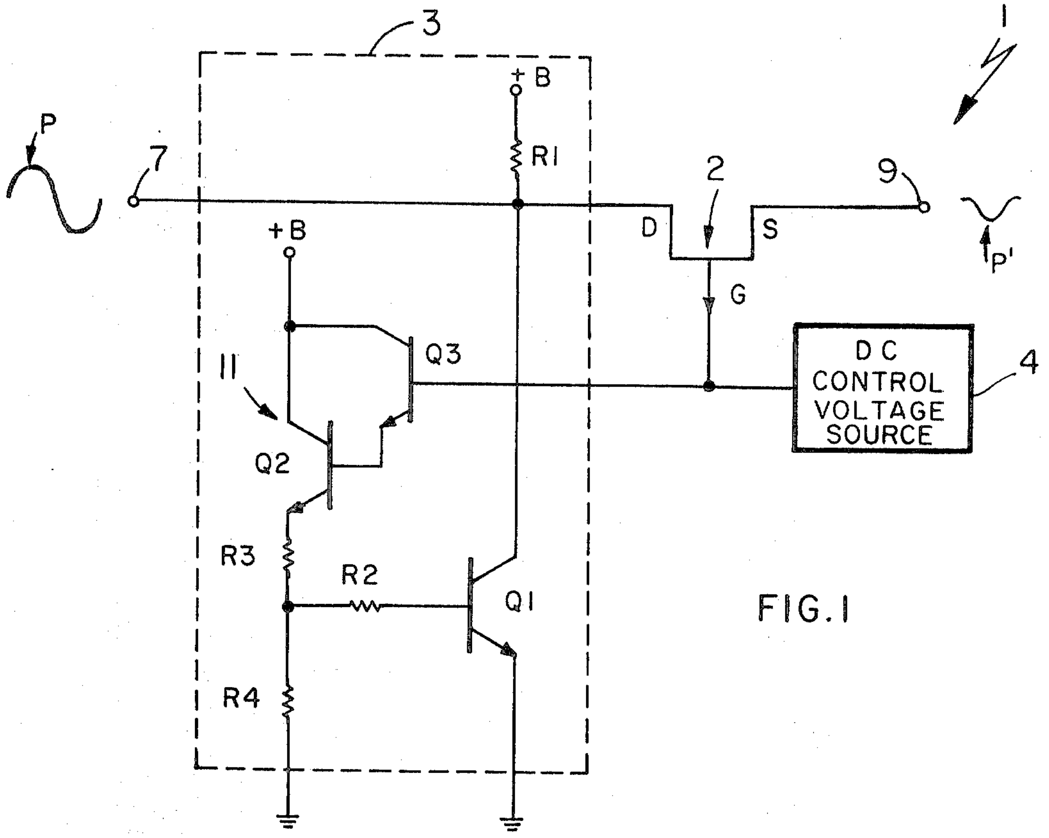
FIG. 1 illustrates an attenuation circuit including a field effect transistor and a bypass circuit in accordance with a preferred form of the present invention.

Referring to FIG. 1, there is shown an attenuation circuit 1 in accordance with a preferred form of the present invention. As indicated in FIG. 1, the attenuation circuit 1 generally comprises a field effect transistor 2, a bypass circuit 3, and a DC control voltage source 4. The field effect transistor 2, of the P-type includes a drain electrode D, a source electrode S, and a gate electrode G. As shown in FIG. 1, the drain electrode D of the field effect transistor 2 is connected directly to an input terminal 7 of the attenuation circuit 1 and the source electrode S is connected directly to an output terminal 9 of the attenuation circuit 1. As will be explained in detail hereinafter, an input signal applied to the input terminal 7 of the attenuation circuit 1 is attenuated by the attenuation circuit 1 and applied to the output terminal 9.

The bypass circuit 1 of FIG. 1 includes an NPN bypass transistor Q1. The collector of the bypass transistor Q1 is connected directly to the drain electrode D of the field effect transistor 2 and also to a source of positive DC potential +B through a current-limiting resistor R1. The base of the bypass transistor Q1 is coupled via a coupling resistor R2 to the juncture of a pair of series-connected voltage-divider resistors R3 and R4, and the emitter is connected directly to ground reference potential. The bypass circuit 3 further includes a pair of NPN transistors Q2 and Q3 connected to each other and to the source of positive DC potential +B in a conventional Darlington arrangement 11. As indicated in FIG. 1, the Darlington arrangement 11 is connected in the attenuation circuit 1 with the emitter of the Darlington transistor Q2 being connected in series with the voltage-divider resistors R3 and R4 (the remote end of the resistor R4 being connected to ground potential), and the base of the Darlington transistor Q3 being connected to the juncture of the gate electrode G of the field effect transistor 2 and the DC control voltage source 4. The purpose of the Darlington arrangement 11 is to isolate the gate electrode G of the field effect transistor 2 from the voltage-divider resistors R3 and R4 thereby preventing loading of the gate electrode G of the field effect transistor 2. The DC control voltage source 4 of FIG. 1 may take the form of a single source, as shown, or two separate sources respectively connected to the gate electrode G of the field effect transistor 2 and to the base of the Darlington transistor Q3.

Figure 2:
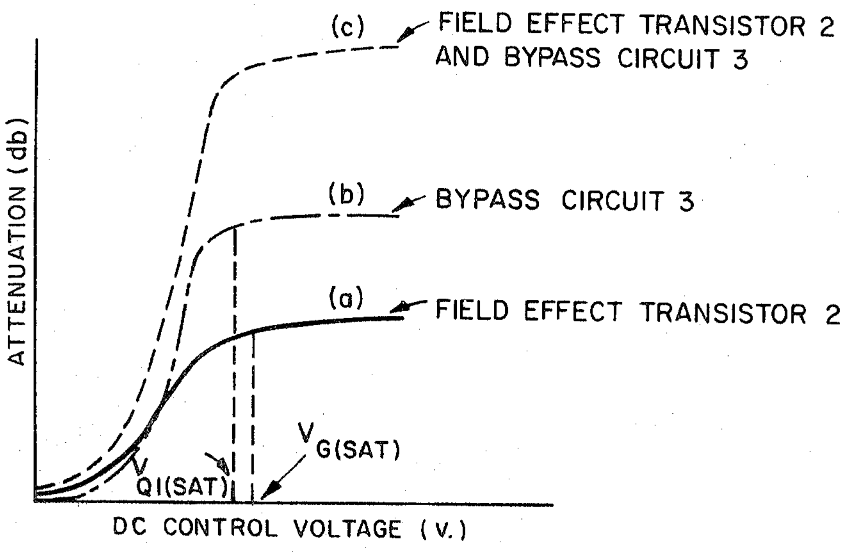
FIG. 2 illustrates respective attenuation-voltage curves for the field effect transistor and the bypass circuit included in the attenuation circuit of the invention, and also a resultant attenuation-voltage curve representing a combination of the values of the respective attenuation-voltage curves for the field effect transistor and the bypass circuit.

OPERATION—FIGS. 1 and 2

In the operation of the attenuation circuit 1 of FIG. 1, an input signal, for example, an AC input signal such as shown at P in FIG. 1, is applied to the input terminal 7 of the attenuation circuit 1, and a DC control voltage is applied by the DC control voltage source 4 to the gate electrode G of the field effect transistor 2 and also to the base of the Darlington transistor Q3. The field effect transistor 2 operates in response to the DC control voltage applied to its gate electrode G to establish a resistance between its drain electrode D and its source electrode S having a value related to the value of the DC control voltage. As a result, the AC input signal P present at its drain electrode D is attenuated as a function of the value of the resistance established between the drain electrode D and the source electrode S and, thus, as a function of the DC control voltage applied to the gate electrode G. The curve of attenuation-versus-DC control voltage for the field effect transistor 2 is shown at (a) in FIG. 2. As indicated in curve (a), the value of attenuation provided by the field effect transistor 2 increases progressively with increases in the value of DC control voltage until the saturation gate voltage $V_{G(SAT)}$ is reached (at the "knee" of the curve). For values of DC control voltage greater than the saturation gate voltage $V_{G(SAT)}$, there is very little increase in attenuation provided by the field effect transistor 2 (due to its being saturated). It is clear, therefore, that the range of attenuation values which the field effect transistor 2 alone is capable of providing is limited. As will now be described, the range of attenuation values of the field effect transistor 2 may be "extended" to result in an overall increased range of attenuation values by means of the bypass circuit 3.

The DC control voltage applied to the base of the Darlington transistor Q3 by the DC control voltage source 4 is sufficient to forward bias the base-emitter junctions of both Darlington transistors Q2 and Q3, thereby establishing current flow in the emitter circuit of the Darlington transistor Q3 to the voltage-divider resistors R3 and R4. As a consequence of the current flow through the voltage-divider resistors R3 and R4, a gating voltage is developed across the voltage-divider resistor R4 which is sufficient to forward bias the base-emitter junction of the bypass transistor Q1 and thereby establish conduction in the bypass transistor Q1. As conduction takes place in the bypass transistor Q1 (which occurs at essentially the same time as the field effect transistor 2 is placed in operation), a portion of the AC input signal P is coupled through the bypass transistor Q1, from collector to emitter, to ground potential, thereby providing partial attenuation of the AC input signal P. The particular amount of attenuation provided by the bypass circuit 3 is determined by the value of the DC control voltage produced by the DC control voltage source 4 and also by the parameters of the components comprising the bypass circuit 3. A typical curve of attenuation-versus-DC control voltage for the bypass circuit 3 shown at (b) in FIG. 2. As indicated by the curve (b), the attenuation provided by the bypass circuit 3 increases rapidly with increases in the DC control voltage until a value of voltage $V_{Q1(SAT)}$ is reached. At this time, the bypass transistor Q1 operates in its saturation condition and prevents further significant increases in attenuation, as indicated by the "flat" portion of the curve (b).

As a result of the above-described operation of the field effect transistor 2 and the bypass circuit 3 to attenuate essentially simultaneously the AC input signal P applied to the input terminal 7 of the attenuation circuit 1, each by an amount determined by the curves (a) and (b) in FIG. 2, an attenuated output signal P′ is produced at the source electrode S of the field effect transistor 2 and, thus, at the output terminal of the attenuation circuit 1. The particular amplitude of the attenuated output signal P′ is determined by the combined attenuation values provided by the field effect transistor 2 and by the bypass circuit 3. The curve representing the joint attenuation effects of the field effect transistor 2 and the bypass circuit 3 is shown at (c) in FIG. 2 and represents a combination of the individual attenuation values of the curves (a) and (b). It is apparent from curves (a)–(c), therefore, that due to the bypass circuit 3, the AC input signal P may be attenuated by an amount greater than that possible using the field effect transistor 2 alone. In other words, in accordance with the present invention, the range of attenuation values of the field effect transistor 2 is extended by use of the bypass circuit 3.

Figure 3:
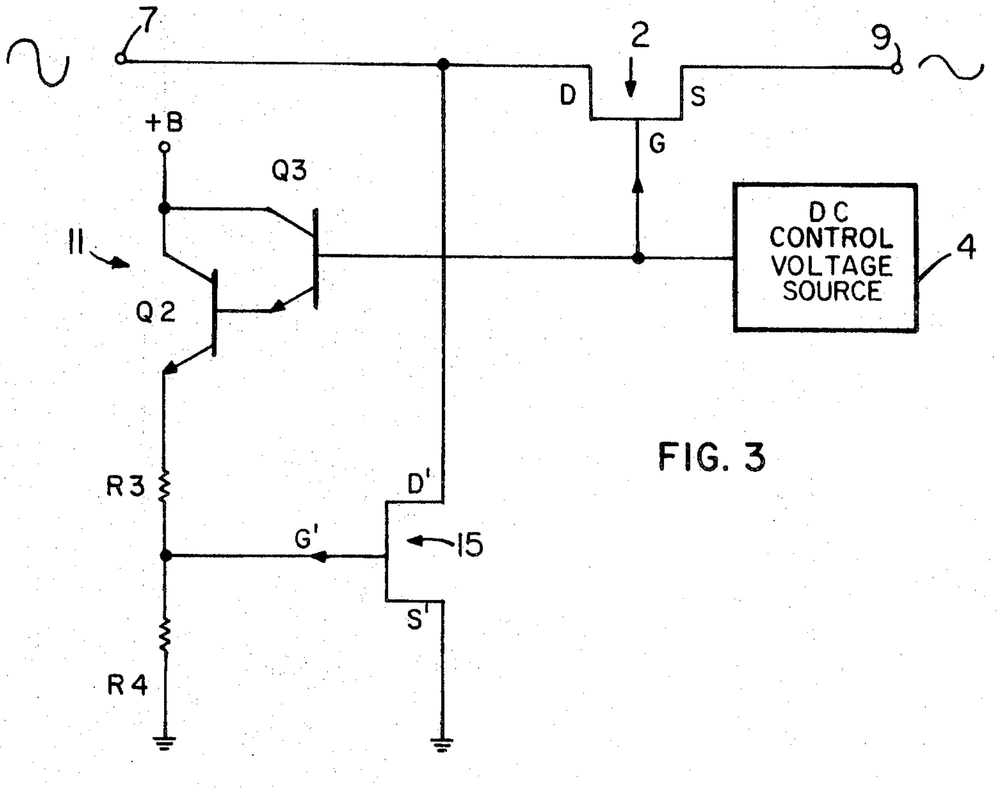
FIG. 3 illustrates an alternative embodiment of the attenuation circuit of FIG. 1.

It is to be noted from FIG. 1 that the attenuated output signal P′ produced at the output terminal 9 of the attenuation circuit 1 represents essentially the negative half cycle of the AC input signal P. This particular output signal configuration is produced by the attenuation circuit 1 due to the fact that when the bypass transistor Q1 is operating in its saturation conducting state (flat portion of curve (b)), it acts as a rectifier (biased for current flow to ground potential) and shunts the positive half cycle of the AC input signal P to ground potential. Although not indicated in FIG. 1, when the bypass transistor Q1 is not operating in its saturation conducting state (the "steep" portion of curve (b)), an attenuated portion of the positive half cycle of the AC input signal P, depending on the degree of conduction in the bypass transistor Q1, also appears at the output terminal 9 of the attenuation circuit 1. It is clear from the above discussion, therefore, that the attenuation circuit 1 of FIG. 1 is particularly suitable for applications where half-wave rectification is desired in addition to attenuation or where the attenuation (that is, amplitude) aspect is more important than the particular shape of the output signal. If it is desired, however, that the output signal be of the same configuration as the input signal, the attenuation circuit 1 of FIG. 1 may be modified, as shown in FIG. 3, by replacing the bypass transistor Q1 and the coupling resistor R2 of FIG. 1 with a field effect transistor and by eliminating the source of positive DC potential +B and the current-limiting resistor R1. As shown in FIG. 3, a P-type field effect transistor 15 is provided having its gate electrode G′ connected to the juncture of the voltage-divider resistors R3 and R4, its drain electrode D′ connected to the drain electrode D of the field effect transistor 2, and its source electrode S′ connected to ground reference potential. Since the field effect transistor 15 does not provide rectification when in operation, the attenuation circuit 1 of FIG. 3 operates in response to an input signal (e.g., an AC input signal) to provide an output signal (attenuated) of the same configuration as the input signal.

MODIFICATIONS —FIGS. 4,5

Although a particular type of variable-resistance device, namely, the field effect transistor 2, has been disclosed for use in the attenuation circuit 1 of FIG. 1, it is to be appreciated that variable-resistance devices other than field effect transistors may be employed in the present invention. For example, the field effect transistor 2 of FIG. 1 may be replaced by a dual-transistor variable-resistance arrangement, as shown, for example, in FIG. 4, or by an optical variable-resistance arrangement, as shown, for example, in FIG. 5.

Figure 4:
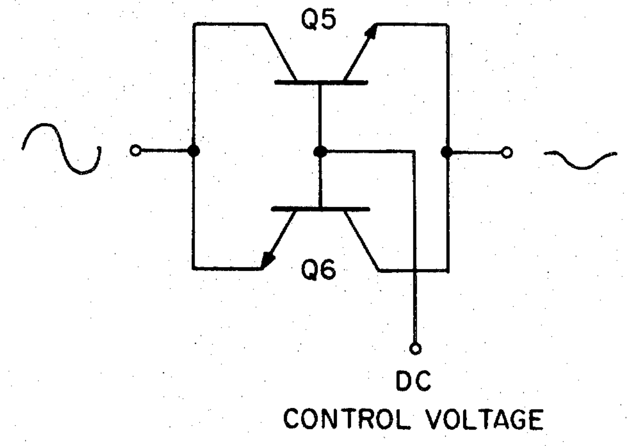
FIG. 4 illustrates a dual-transistor variable-resistance arrangement which may be employed in the attenuation circuit of FIG. 1 in place of the field effect transistor.

The dual-transistor variable-resistance arrangement of FIG. 4 comprises a pair of matched NPN transistors Q5 and Q6 in which the bases of the transistors Q5 and Q6 are connected together, the collector of the transistor Q5 and the emitter of the transistor Q6 are connected together, and the emitter of the transistor Q5 and the collector of the transistor Q6 are connected together. A DC control voltage for operating the transistors Q5 and Q6 to vary their resistance is applied to the juncture of the bases of the transistors Q5 and Q6.

Figure 5:
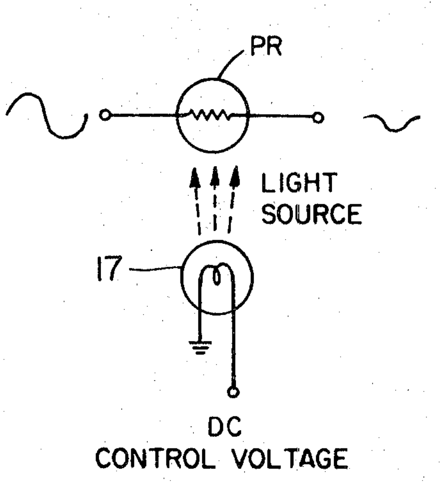
FIG. 5 illustrates an optical variable-resistance arrangement which may be employed in the attenuation circuit of FIG. 1 in place of the field effect transistor.

As shown in FIG. 5, the aforementioned optical ra arrangement comprises a photoresponsive resistance device PR and a light source 17. In operation, a DC control voltage controls the light output of the light source 17 thereby controlling the value of the resistance of the photorespomsove resistance device PR. In addition to the above modifications, it is to be appreciated that the field effect transistor 15 of FIG. 3 may also be replaced with a different type of variable-resistance arrangement, for example, as shown in FIG. 4 or as shown in FIG. 5. Other modifications, variations, and changes will also be obvious to those skilled in the art without departing from the invention as called for in the appended claims.

What is claimed is:

1. An attenuation circuit for attenuating an input signal, comprising: receiving a variable-impedance means having a first terminal for receiving an input signal to be attenuated, a second terminal, and a control terminal;

bypass circuit means having a first connection to the first terminal of the variable-impedance means, and a control signal connection; and control signal source means adapted to apply a control signal to the control terminal of the variable-impedance means and to the control signal connection of the bypass circuit means;

said variable-impedance means being operable in response to the control signal at the control terminal thereof to establish an impedance between its first and second terminals having a value related to the value of the control signal whereby an input signal at the first terminal of the variable-impedance means is attenuated by the variable-impedance means by an amount related to the value of the impedance between its first and second terminals; and said bypass circuit means being operable in response to the control signal at the control signal connection thereof to bypass a portion of the input signal at the first terminal of the variable-impedance means away from the first terminal thereby to attenuate the input signal by a predetermined amount, said amount being related to the value of the control signal;

whereby said input signal at the first terminal of the variable-impedance means is attenuated by a total amount determined by the combined amounts of attenuation provided by the variable-impedance means and by the bypass circuit means, the resulting attenuated input signal occurring at the second terminal of the variable-impedance means.

2. An attenuation circuit for attenuating an input signal, comprising:

variable-impedance means having a first terminal for receiving an input signal to be attenuated, a second terminal, and a control terminal;

a source of reference potential;

transistor means coupled to the first terminal of the variable-impedance means and to the source of reference potential and including a control connection, said transistor means being adapted to operate in a conducting condition when a gating signal is present at the control connection thereof;

circuit means coupled to the control connection of the transistor means and including a control signal connection;

control signal source means adapted to apply a control signal to the control terminal of the variable-impedance means and to the control signal connection of the circuit means;

said variable-impedance means being operable in response to the control signal at the control terminal thereof to establish an impedance between its first and second terminals having a value related to the value of the control signal whereby an input signal at the first terminal of the variable-impedance means is attenuated by the variable-attenuation means by an amount related to the value of the impedance between its first and second terminals; and said circuit means being operable in response to the control signal at the control signal connection thereof to produce a gating signal at the control connection of the transistor means having a value related to the value of the control signal, said gating signal causing the transistor means to operate in its conducting condition and to bypass a portion of the input signal at the first terminal of the variable-impedance means to the source of reference potential thereby to attenuate the input signal by a predetermined amount, said amount being related to the degree of conduction in the transistor means as established by the value of the gating signal;

whereby said input signal at the first terminal of the variable-impedance means is attenuated by a total amount determined by the combined amounts of attenuation provided by the variable-impedance means and by the transistor means and the circuit means, the resulting attenuated input signal occurring at the second terminal of the variable-impedance means.

3. An attenuation circuit in accordance with claim 2 wherein the transistor means includes:

a transistor having base, collector, and emitter, the base being coupled to the control connection, the collector being coupled to the first terminal of the variable-impedance means, and the emitter being coupled to the source of reference potential.

4. An attenuation circuit in accordance with claim 2 wherein the circuit means includes a voltage-divider circuit coupled to the control connection of the transistor means and to the source of reference potential.

5. An attenuation circuit in accordance with claim 4 wherein the circuit means further includes a Darlington circuit coupled to the voltage divider circuit and to the control signal connection.

6. An attenuation circuit in accordance with claim 2 wherein the transistor means includes:

a field effect transistor having a first electrode, a second electrode, and a gate electrode, the first electrode being coupled to the first terminal of the variable-impedance means, the second electrode being coupled to the source of reference potential, and the gate electrode being coupled to the control connection.

7. An attenuation circuit in accordance with claim 6 wherein:

the first and second electrodes of the field effect transistor are drain and source electrodes, respectively.

8. An attenuation circuit in accordance with claim 2 wherein the transistor means includes:

first and second transistors each having base, collector, and emitter, the bases of the first and second transistors being coupled to each other and to the control connection, the collector of the first transistor and the emitter of the second transistor being coupled to each other and to the first terminal of the variable-impedance means, and the emitter of the first transistor and the collector of the second transistor being coupled to each other and to the source of reference potential.

9. An attenuation circuit in accordance with claim 1 wherein the variable-impedance means includes:

a field effect transistor having a first electrode, a second electrode, and a gate electrode, the first electrode being coupled to the first terminal, the second electrode being coupled to the second terminal, and the gate electrode being coupled to the control terminal.

10. An attenuation circuit in accordance with claim 9 wherein:

the first and second electrodes of the field effect transistor are drain and source electrodes, respectively.

11. An attenuation circuit in accordance with claim 1 wherein the variable-impedance means includes:

first and second transistors each having base, collector, and emitter, the bases of the first and second transistors being coupled to each other and to the control terminal, the collector of the first transistor and the emitter of the second transistor being coupled to each other and to the first terminal, and the emitter of the first transistor and the collector of the second transistor being coupled to each other and to the second terminal.

12. An attenuation circuit in accordance with claim 1 wherein the variable-impedance means includes:

a photoresponsive resistance device coupled between the first and second terminals; and a light source coupled to the control terminal and adapted to produce a light output for controlling the value of resistance of the photoresponsive resistance device.

PO-1050
(5/69)

UNITED STATES PATENT OFFICE
CERTIFICATE OF CORRECTION

Patent No. 3,621,284 Dated November 16, 1971

Inventor(s) Ronald D. Cluett and Vincent E. Larka

It is certified that error appears in the above-identified patent and that said Letters Patent are hereby corrected as shown below:

Column 1, line 29 of the specification "it" should read--in--.

Column 1, line 51 of the specification insert the following between "means" and "by"--is attenuated by the variable impedance means--.

Column 4, line 63 of Claim 1 delete "receiving".

Signed and sealed this 23rd day of May 1972.

(SEAL)
Attest:

EDWARD M.FLETCHER,JR.
Attesting Officer

ROBERT GOTTSCHALK
Commissioner of Patents